(12) United States Patent
Lemke et al.

(10) Patent No.: US 6,443,750 B1
(45) Date of Patent: Sep. 3, 2002

(54) ELECTRICAL CONNECTOR

(75) Inventors: Timothy A. Lemke, Dillsburg; Lewis R. Johnson, Liverpool; Timothy W. Houtz, Etters, all of PA (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 09/632,060

(22) Filed: Aug. 3, 2000

Related U.S. Application Data

(60) Provisional application No. 60/147,120, filed on Aug. 4, 1999, and provisional application No. 60/147,118, filed on Aug. 4, 1999.

(51) Int. Cl.[7] .................................................. H01R 4/50
(52) U.S. Cl. ........................................ 439/341; 439/70
(58) Field of Search ............................. 439/70, 71, 83, 439/341, 342, 331

(56) References Cited

U.S. PATENT DOCUMENTS

| | | | |
|---|---|---|---|
| 4,330,163 A | 5/1982 | Aikens et al. ................. 439/71 |
| 4,422,703 A | 12/1983 | Christensen et al. ......... 439/266 |
| 4,468,076 A | 8/1984 | Hine et al. ................... 439/368 |
| 4,501,461 A | 2/1985 | Anhalt ......................... 439/296 |
| 4,679,118 A | 7/1987 | Johnson et al. .............. 361/386 |
| 4,761,140 A | 8/1988 | Geib ............................ 439/71 |
| 4,832,611 A | * 5/1989 | Noda et al. ................... 439/70 |
| 4,887,974 A | * 12/1989 | Ichimura et al. ............. 439/259 |
| 5,044,973 A | 9/1991 | Noda et al. .................. 439/296 |
| 5,254,012 A | 10/1993 | Wang .......................... 439/263 |
| 5,370,549 A | 12/1994 | Lee ............................. 439/342 |
| 5,518,410 A | * 5/1996 | Masami ........................ 439/71 |
| 5,547,389 A | 8/1996 | Hsu ............................. 439/342 |
| 5,611,705 A | * 3/1997 | Pfaff .......................... 439/266 |
| 5,628,636 A | 5/1997 | Ollivier ....................... 439/70 |
| 5,702,256 A | 12/1997 | Severn ........................ 439/71 |
| 5,762,511 A | 6/1998 | Scheitz et al. .............. 439/342 |
| 5,973,924 A | * 10/1999 | Gillespie, Jr. ............... 361/735 |
| 6,022,236 A | * 2/2000 | McHugh et al. ............. 439/342 |
| 6,024,584 A | 2/2000 | Lemke et al. ................. 439/83 |
| 6,059,596 A | 5/2000 | Pei et al. ..................... 439/342 |
| 6,077,099 A | * 6/2000 | Pei et al. ..................... 439/342 |
| 6,086,386 A | 7/2000 | Fjelstad et al. .............. 439/70 |
| 6,093,035 A | 7/2000 | Lemke et al. ................. 439/83 |
| 6,093,042 A | 7/2000 | Lemke et al. ............... 439/341 |
| 6,113,412 A | * 9/2000 | Lin ............................. 439/342 |
| 6,217,361 B1 | 4/2001 | Murr .......................... 439/342 |
| 6,220,870 B1 | * 4/2001 | Barabi et al. ................. 439/71 |

* cited by examiner

Primary Examiner—Tulsidas Patel
(74) Attorney, Agent, or Firm—Woodcock Washburn LLP

(57) ABSTRACT

An electrical connector mountable to a substrate, including: a frame mountable to the substrate; a housing supported by the frame; and a plurality of contacts extending through said housing and mountable to the substrate. A socket for connecting an electrical component to a substrate, including: a housing; a frame; and a cover. The housing includes: a contact mountable to the substrate and adapted to engage a terminal of the electrical component, and guidance structure. The frame is mountable to the substrate and supports the housing. The cover movably secures to the frame and includes: guidance structure that corresponds to the guidance structure on the housing so that the cover aligns with the housing and can move between a first and a second position; and an opening so that the contact can engage the terminal of the electrical component.

35 Claims, 21 Drawing Sheets

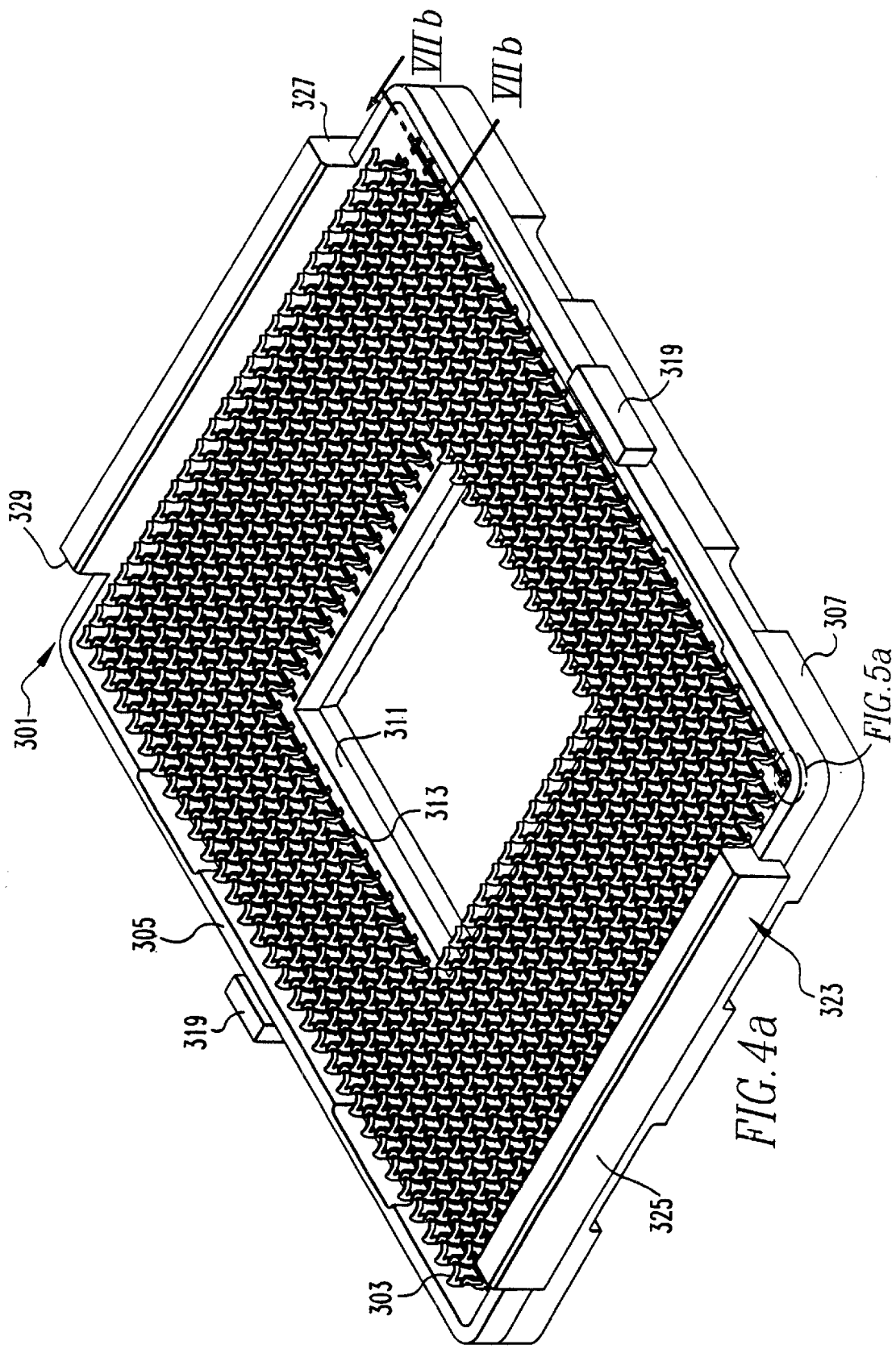

ELECTRICAL CONNECTOR

CROSS-REFERENCE TO RELATED APPLICATIONS

This Application claims priority to Provisional Patent Application No. 60/147,120, filed on Aug. 04, 1999, and Provisional Patent Application No. 60/147,118, filed on Aug. 04, 1999, both of which are herein incorporated by reference.

BACKGROUND OF THE INVENTION

1. Field of the Invention

The present invention relates to electrical connectors. More specifically, the present invention relates to zero insertion force (ZIF) sockets.

2. Brief Description of Earlier Developments

A common application for ZIF sockets involves connecting a microprocessor to a circuit board. Each subsequent microprocessor generation poses greater demands on the socket design. For example, new microprocessors may require smaller centerline spacing between contacts, greater pin count or increased coplanarity. While conventional socket designs provide suitable results for existing microprocessors, these socket designs may not prove adequate in future generations of microprocessors.

SUMMARY OF THE INVENTION

It is an object of the present invention to provide an electrical connector that exhibits reduced stress levels at the solder joints.

It is a further object of the present invention to provide an electrical connector capable of accommodating mismatches in the coefficients of thermal expansion (CTE) of the various materials used in the electronic device.

It is a further object of the present invention to provide a socket that does not transmit forces caused by actuation of the socket to the solder joints.

It is a further object of the present invention to provide an electrical connector having satisfactory coplanarity.

It is a further object of the present invention to provide an electrical connector with improved manufacturability.

It is a further object of the present invention to provide an electrical connector exhibiting improved mold flow characteristics.

It is a further object of the present invention to provide an electrical connector with improved reliability.

It is a further object of the present invention to provide an electrical connector that exhibits greater flexibility.

It is a further object of the present invention to provide an electrical connector with a contact housing having greater compliancy.

It is a further object of the present invention to provide an electrical connector modularly assembled from several components.

It is a further object of the present invention to provide an electrical connector formed from loosely coupled components.

These and other objects of the present invention are achieved in one aspect of the present invention by an electrical connector mountable to a substrate, comprising: a frame mountable to the substrate; a housing supported by the frame; and a plurality of contacts extending through the housing and mountable to the substrate.

These and other objects of the present invention are achieved in another aspect of the present invention by a socket for connecting an electrical component to a substrate, comprising: a housing; a frame; and a cover. The housing includes: a contact mountable to the substrate and adapted to engage a terminal of the electrical component, and guidance structure. The frame mounts to the substrate and supports the housing. The cover movably secures to the frame and includes: guidance structure that corresponds to the guidance structure on the housing so that the cover aligns with the housing and can move between a first and a second position; and an opening so that the contact can engage the terminal of the electrical component.

These and other objects of the present invention are achieved in another aspect of the present invention by an electrical system, comprising: an electrical component having a terminal; a substrate having a conductive element; and an electrical connector mounted to the substrate and adapted to removably secure the electrical component to the substrate. The connector comprises: a housing; a frame; and a cover. The housing includes: a contact mounted to the substrate and adapted to engage a terminal of the electrical component, and guidance structure. The frame mounts to the substrate and supports the housing. The cover movably secures to the frame and includes: guidance structure that corresponds to the guidance structure on the housing so that the cover aligns with the housing and can move between a first and a second position; and an opening so that the contact can engage the terminal of the electrical component.

BRIEF DESCRIPTION OF THE DRAWINGS

Other uses and advantages of the present invention will become apparent to those skilled in the art upon reference to the specification and the drawings, in which:

FIG. 1b is a bottom perspective view of the electrical connector in FIG. 1a;

FIG. 3a is a top perspective view of one sub-assembly of the electrical connector in FIG. 1a;

FIG. 3b is a bottom perspective view of the sub-assembly in FIG. 3a;

FIG. 4a is a top perspective view of another sub-assembly of the electrical connector in FIG. 1a;

FIG. 4b is a bottom perspective view of the sub-assembly in FIG. 4a;

FIG. 5a is a detailed view of the sub-assembly shown in FIG. 4a;

FIG. 5b is a bottom perspective view of one of the components in FIG. 4a;

FIG. 6a is a top perspective view of another component of the electrical connector in FIG. 1a;

FIG. 6b is a detailed view of the component in FIG. 6a;

FIG. 7a is a perspective view of one component of the electrical connector in FIG. 2a;

FIG. 7b is an opposite perspective view of the component in FIG. 7a;

FIG. 8a is a top perspective view of another sub-assembly of the electrical connector in FIG. 1a;

FIG. 8b is a bottom perspective view of the sub-assembly in FIG. 6a;

DETAILED DESCRIPTION OF THE PREFERRED EMBODIMENTS

Generally speaking, the present invention is an electrical connector used to connect a first electrical component to a second electrical component. More specifically, the present invention is a socket that connects a microprocessor interposer I having pins P disposed in an array (e.g. PGA) to a motherboard M. The socket receives interposer pins P with zero insertion force (ZIF). Preferably, the socket surface mounts to motherboard M, although other mounting methods could be used. Ball grid array (BGA) technology is the preferred surface mounting technique.

Figure 11:
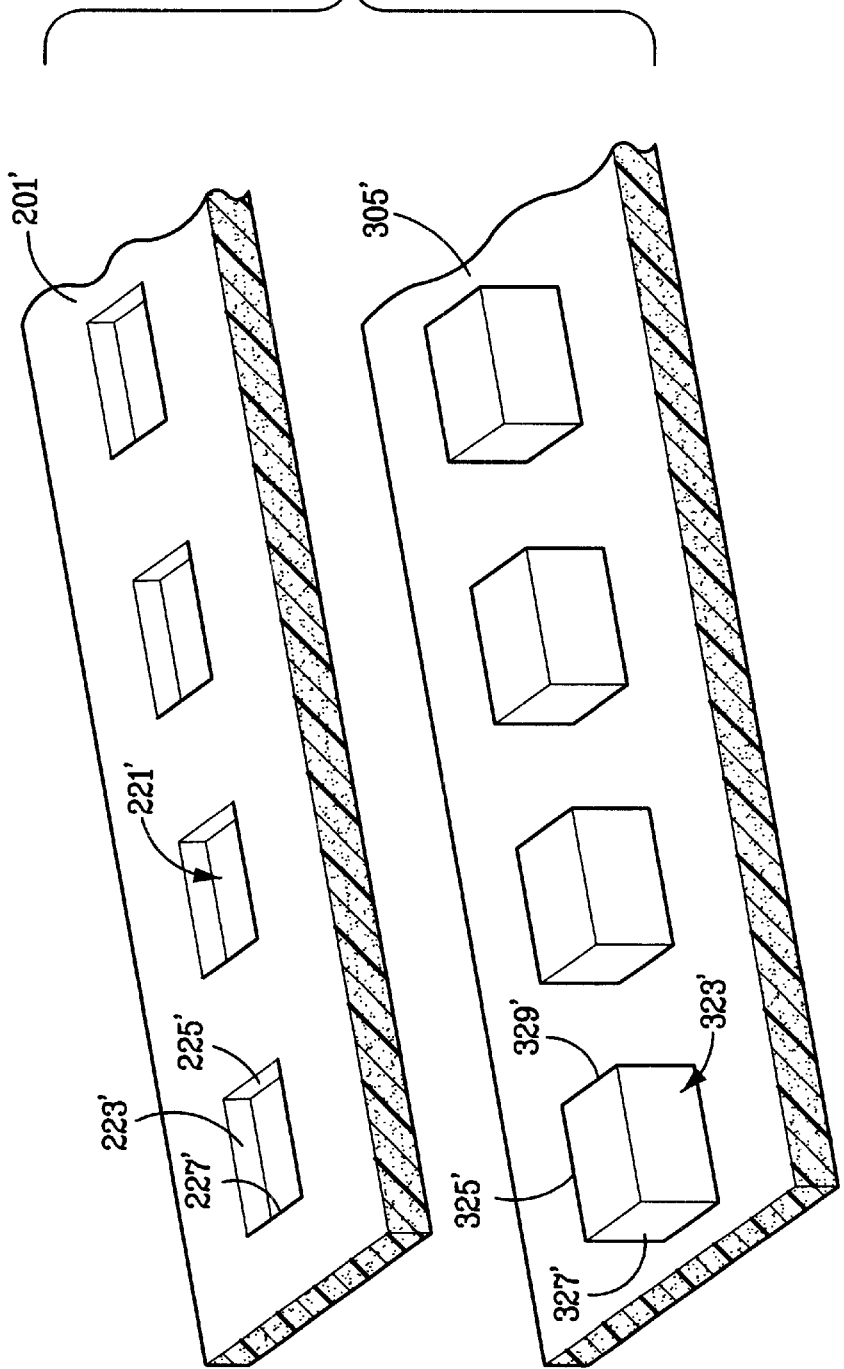
FIG. 11 is a perspective view of several components of an alternative embodiment of the present invention.

The socket is modular, with several sub-assemblies forming the socket. The components of the socket are designed to be flexible. When compared to a comparable unitary structure, the modular socket of the present invention is less rigid. Accordingly, the present invention can better handle stress build up caused by CTE differential between the various materials used in the interposer I, motherboard M and the socket. The present invention can also better handle stresses caused by the mating of the interposer pins P and the socket contacts than a comparable unitary structure. FIGS. 1a–10b present a first alternative embodiment of the present invention while FIG. 11 presents a second alternative embodiment.

Figure 1A:
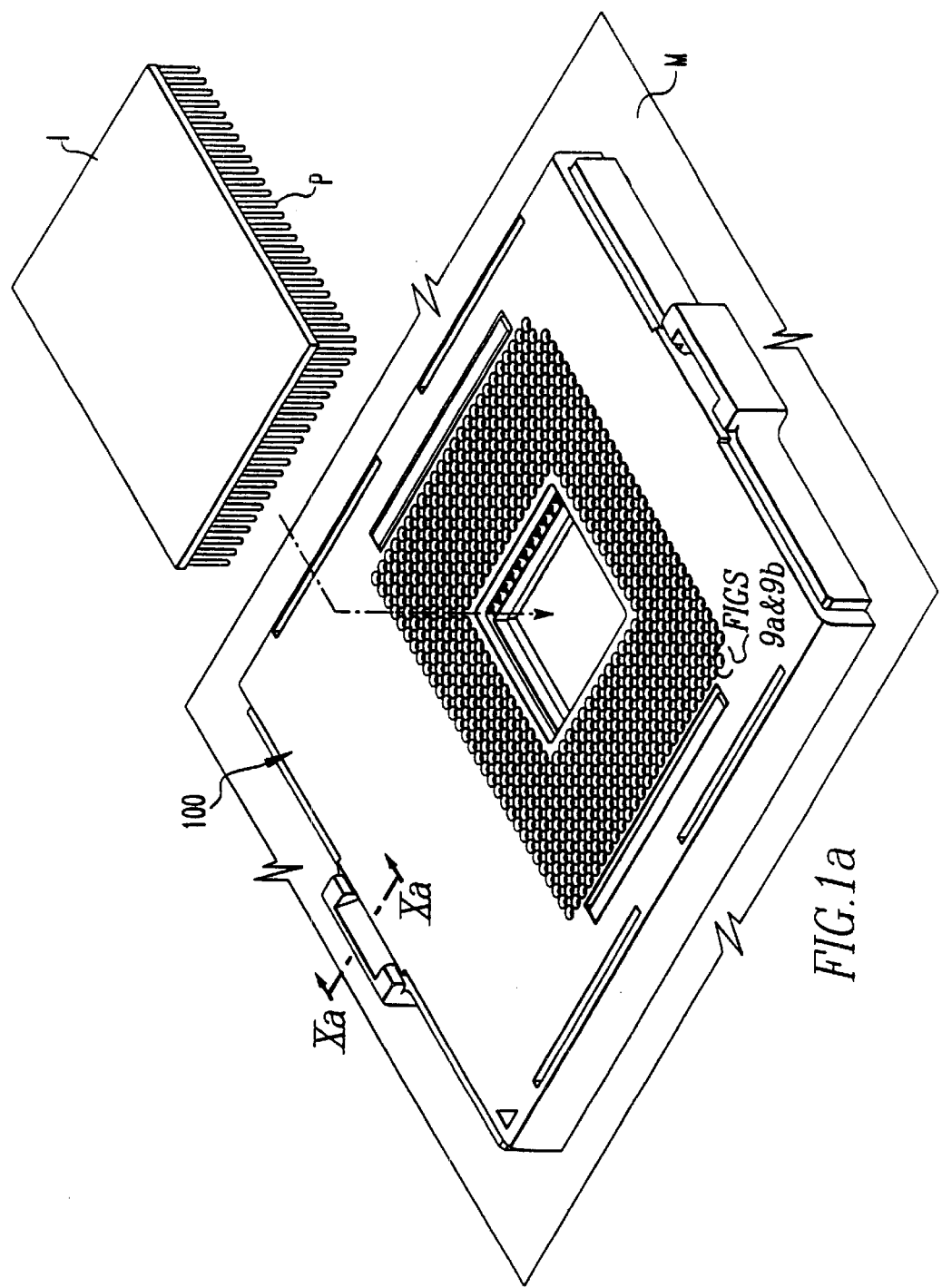
FIG. 1a is a top perspective view of one alternative embodiment of a he present invention in an assembled state.
Figure 1B:
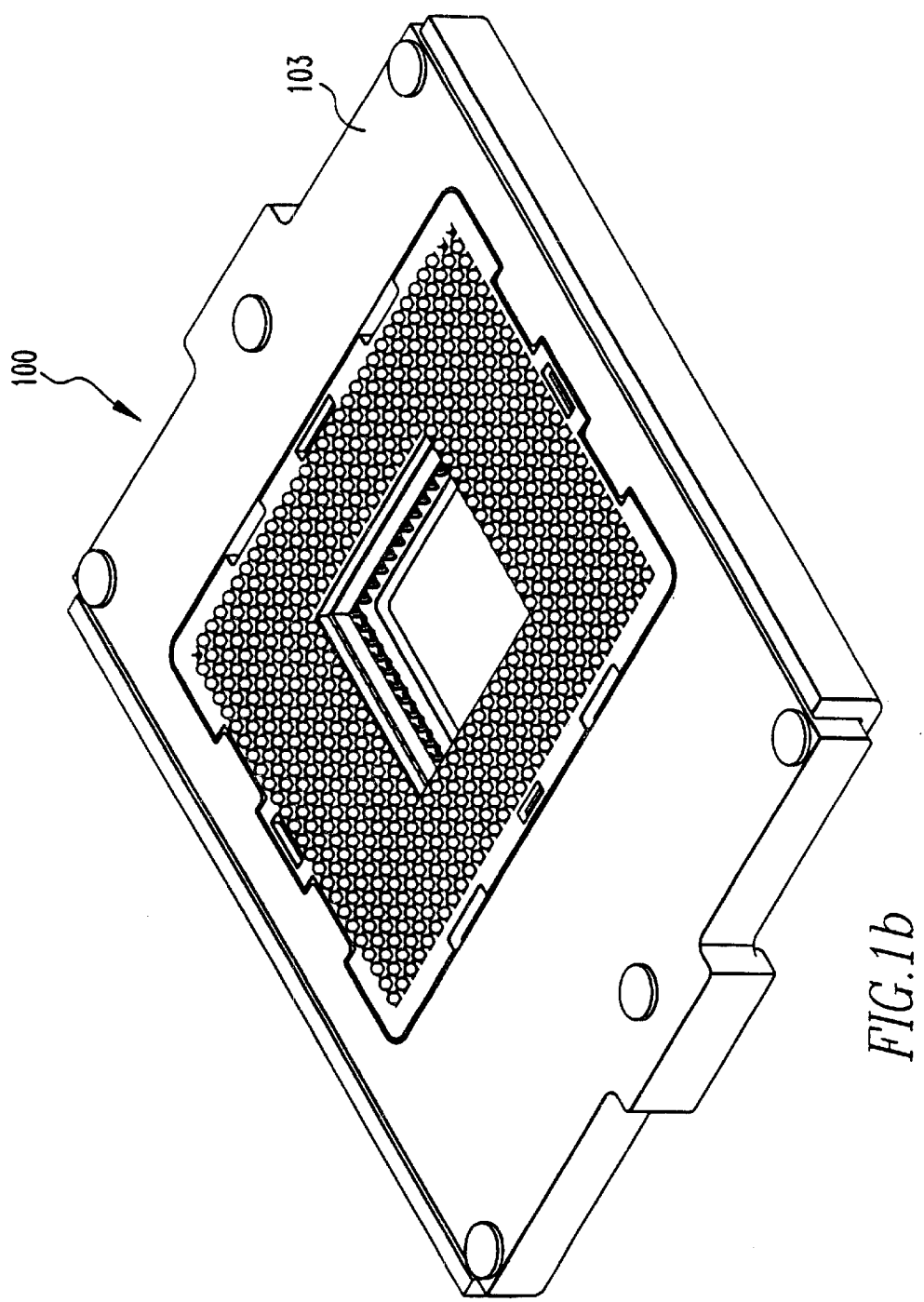

FIGS. 1a and 1b provide a top and a bottom perspective view, respectively, of a socket 100. A top 101 of socket 100 faces, and receives, interposer I. A bottom 103 of socket 100 faces, and mounts to, motherboard M. Although the various figures demonstrate socket 100 as being actuated by a hand tool T, such as a screwdriver, other actuation mechanisms (e.g. a lever rotating an eccentric cam) could be used.

Figure 2:
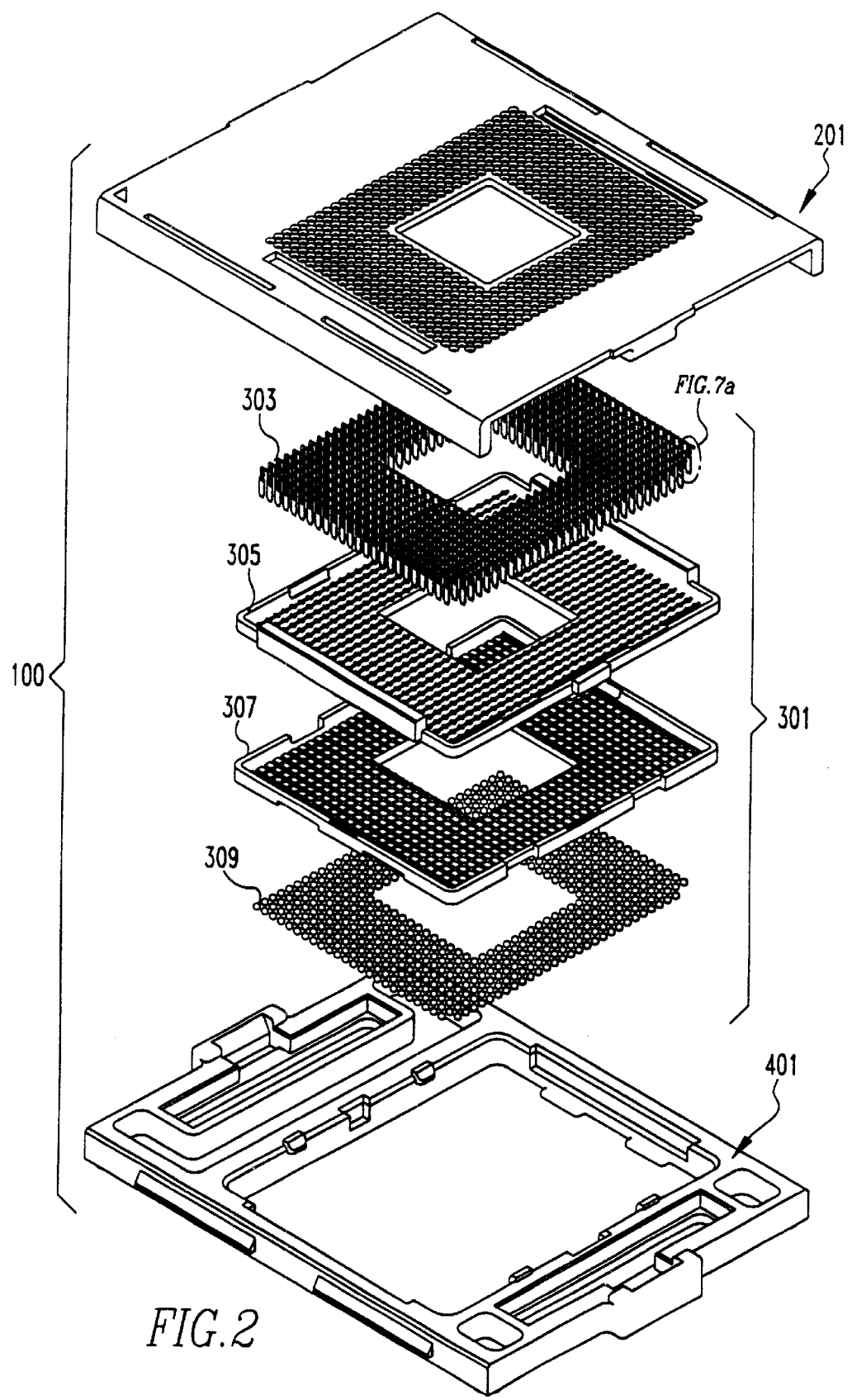
FIG. 2 is an exploded view all of the components and sub-assemblies forming the electrical connector in FIG. 1b.

As seen in FIG. 2, numerous components form socket 100. Socket 100 could include, for example, a cover 201, a plurality of contacts 303, a spacer 305, a contact housing contact housing 307, a plurality of solder masses 309 and a base frame 401. Contacts 303, housing 305, contact housing 307 and solder masses 309, when assembled together, form contact housing sub-assembly 301. As described in more detail below, assembly of socket 100 involves placing contact housing sub-assembly into base frame 401, then securing cover 201 over base frame 401.

Rather than rigidly assembling all of the sub-assemblies together, the present invention loosely couples the sub-assemblies. In other words, the sub-assemblies are not interference fit together. Rather, the various surfaces of the sub-assemblies abut without interference.

Without interference fitting, the present invention encourages some movement between the sub-assemblies. The relative movement of the sub-assemblies as a result of loose coupling helps absorb the stress caused by CTE differential and by the mating of interposer pins P and contacts 303. Whereas a rigid socket would transmit the stresses to the solder joint, a loosely coupled connector does not transmit all of the forces between connected components. Rather, the loosely coupled components individually absorb any stresses. Any stress that might be transmitted between adjacent components is generally an insignificant amount.

The movement between loosely coupled components, while large enough to prevent stress build up in the solder joints, should also be sufficiently small to ensure and maintain proper orientation between the respective sub-assemblies.

Figure 3A:
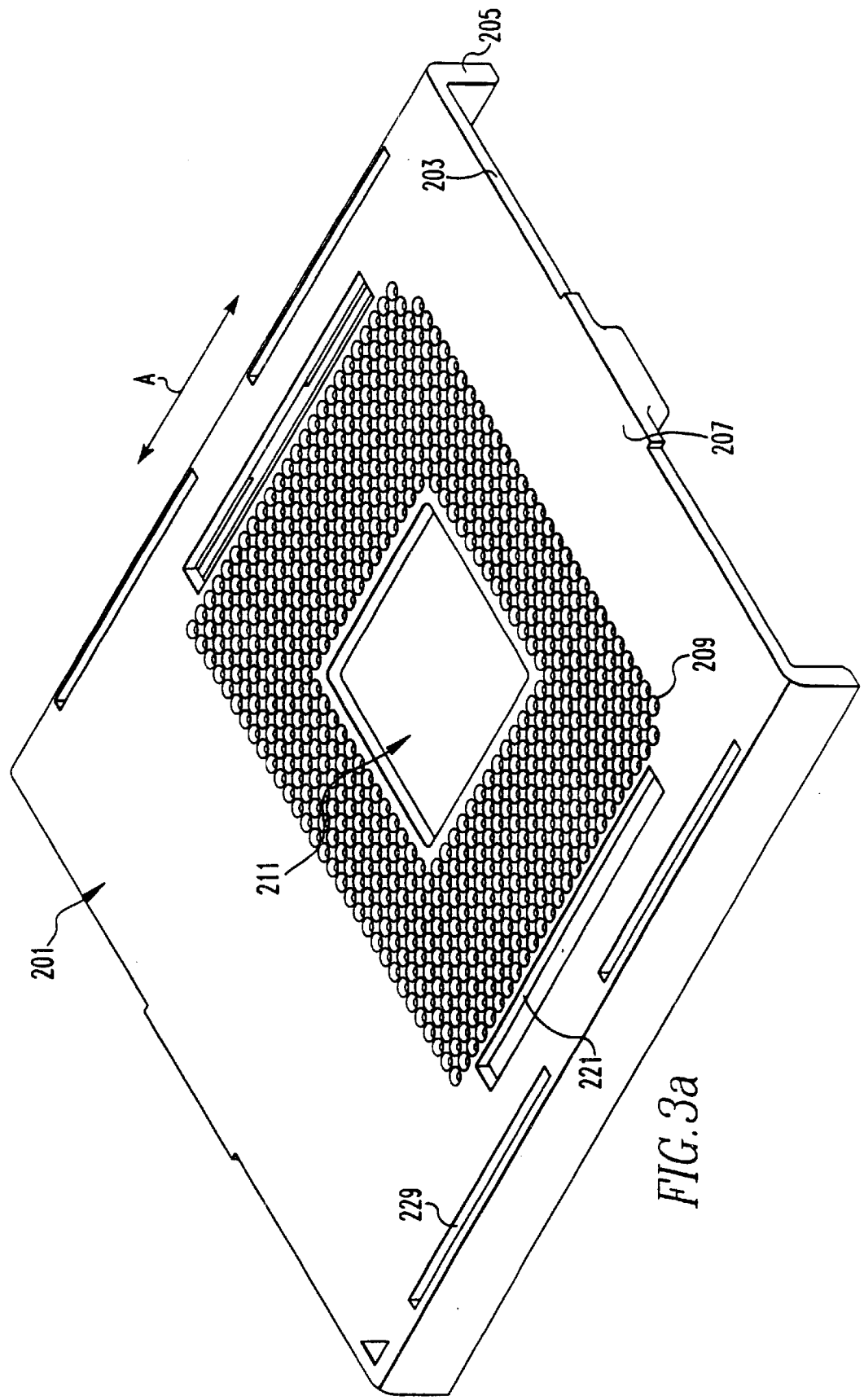
Figure 3B:
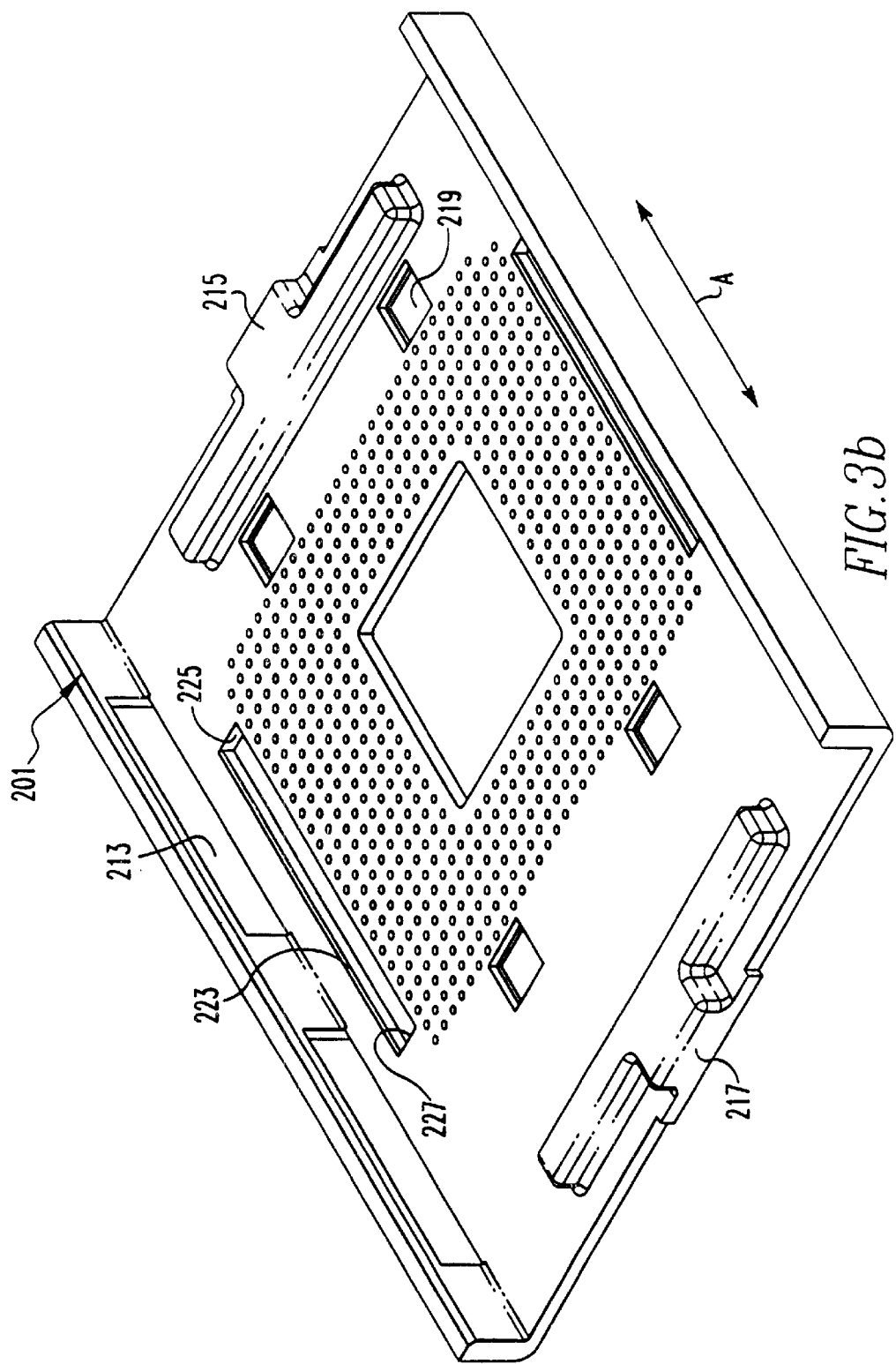

FIGS. 3a and 3b display cover 201. Preferably made from a suitable insulative material such as a high temperature thermoplastic, cover 201 has an upper wall 203 and opposed sidewalls 205.

Since cover 201 must move across base frame 401, the longitudinal axes of sidewalls 205 define the actuation direction indicated by line A. The top surface of upper wall 203 could include printed indicia 207 to assist the socket actuation process discussed below.

Upper wall 203 receives interposer I. Upper wall 203 includes a plurality of apertures 209 sized large enough to allow interposer pins P to pass freely therethrough, but sized small enough to provide lateral support to pins P during mating with contacts 303. The pattern of apertures 209 on cover 201 corresponds to the pattern of interposer pins P. The present invention could, however, have patterns arranged differently than that shown in FIG. 3a in order to receive other interposers (such as an interposer with an interstitial pin grid array).

If designed for one specific interposer, the number of apertures 209 preferably equals the number of interposer pins. In order to, for example, accommodate interposers with differing pin counts, socket 100 could have more apertures 209 than interposer pins P.

As seen in FIG. 3a, cover 201 could include a central opening 211. Generally, cover 201 could have central opening 211 when the interposer provides pins only along its periphery (i.e. no pins at the center). Central opening 211 improves heat dissipation through socket 100 and helps make cover 201 more flexible.

Sidewalls 205 preferably act as latches to secure cover 201 to base frame 401. Assembling socket 100 involves snap fitting sidewalls 205 over latch structure on base frame 401. In order to allow cover 201 to snap fit onto base frame 401, upper wall 203 could include relief slits 229.

Once properly fitted over base frame 401, recesses 213 on the inner surfaces of sidewalls 205 can accept the latch structure on base frame 401 without interference. Recesses 213 communicate with slits 229 in upper wall 203. The lower surface of upper wall 203 rests upon the upper surface of base frame 401 when cover 201 successfully latches to base frame 401.

The latch structure on base frame 401 freely travels within recesses 213 during actuation of socket 100 between an open and a closed position. In other words, the latch structure generally does interfere with the sidewalls that define recesses 213. This loose coupling, along with the loose coupling of the various sub-assemblies of socket 100, helps prevent stresses from building up in the solder joints. The latch structure, while not interfering with recesses 213, is sized so as to ensure proper alignment between cover 201 and base frame 401.

Ribs 215 extend from a bottom surface of upper wall 203 as seen in FIG. 3b. Ribs 215 each have an outwardly directed face 217. Face 217 engages actuating tool T used to urge socket 100 between the open and closed positions. Ribs 215 reside within correspondingly shaped openings in base frame 401 to aid in aligning cover 201 and contact housing sub-assembly 301 without interference.

The bottom surface of upper wall 203 also includes channels 219. Channels 219 accept projections that extend upwardly from base frame 401. The projections travel freely within channels 219 as socket moves between the open and closed positions. In other words, the projections generally do not interfere with the sidewalls defining channels 219. While not interfering with channels, the projections do ensure adequate alignment between cover 201 and base frame 401. Although shown in FIG. 3b as only a recess in cover 201, channels 219 could extend entirely through upper wall 203 of cover 201.

Upper wall 203 also has keyways 221. Keyways 221 accept splines extending from contact housing sub-assembly 301 without interference. Keyways 221 have a guidance surface 223 extending between opposed stop surfaces 225, 227. A corresponding surface on each spline abuts guidance surface 223 to ensure proper alignment between cover 201 (and, necessarily, interposer pins P) and contact housing sub-assembly (and, necessarily, the contacts) as socket 100 travels between the open and closed position.

In the closed position, a corresponding surface of each spline abuts stop surface 225. In the open position, an opposite surface of each spline abuts stop surface 227. In other words, stop surfaces 225, 227 determine the travel limits of cover 201, while guidance surface 223 maintains alignment during movement. In order to have suitable flexibility, cover 201 could be manufactured as follows. Cover 201 could be injection molded using a liquid crystal polymer (LCP). Upper wall 203, which has a 25×31 array of apertures 209 with 0.050" centerline spacing that receive 0.12" diameter interposer pins P, could have a thickness of approximately 1.00 mm. In addition, the thickness of sidewalls 205 could be 1.75 mm.

Figure 4B:
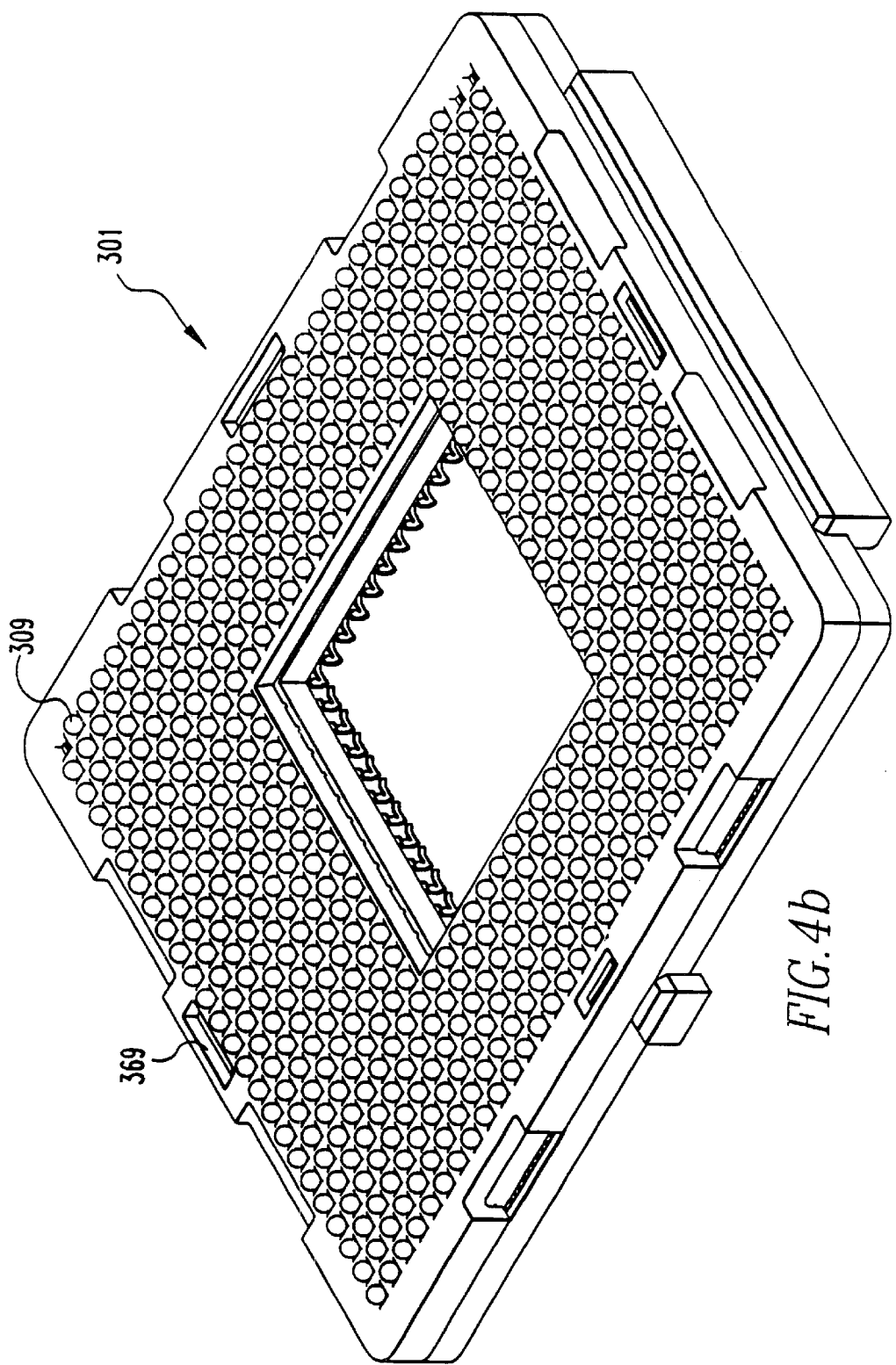

FIGS. 4a and 4b display assembled contact housing sub-assembly 301. As discussed above, contact housing sub-assembly 301 includes contacts 303, spacer 305, contact housing 307 and solder masses 309. If surface mounting of socket 100 is not required or if a different type of surface mount technique is used, solder masses 309 may not be required. Each component of contact housing sub-assembly 301 will now be described.

FIGS. 4a, 5a, 5b and 5c display spacer 305, which is preferably used to increase the mating height of socket 100. Spacer 305, preferably made from a suitable insulative material such as a high temperature thermoplastic, has a planar base 311 with an array of apertures 313 therethrough. A peripheral wall 315 extends around, and upwardly from, base 311. A peripheral recess 365 extends around base 311.

Figure 5A:
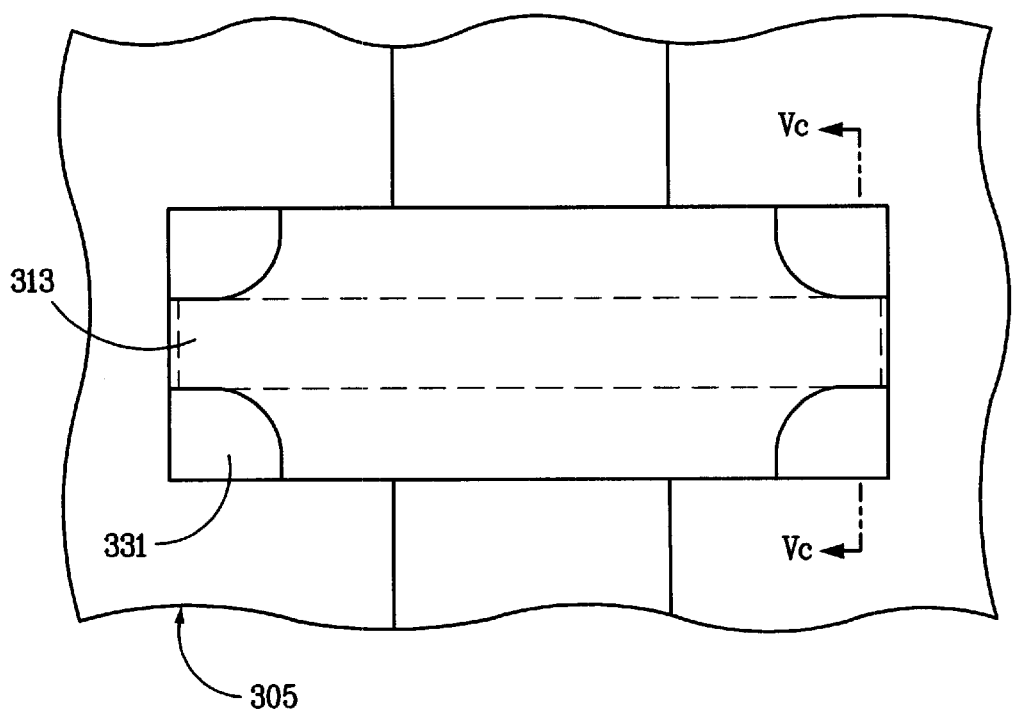
Figure 5B:
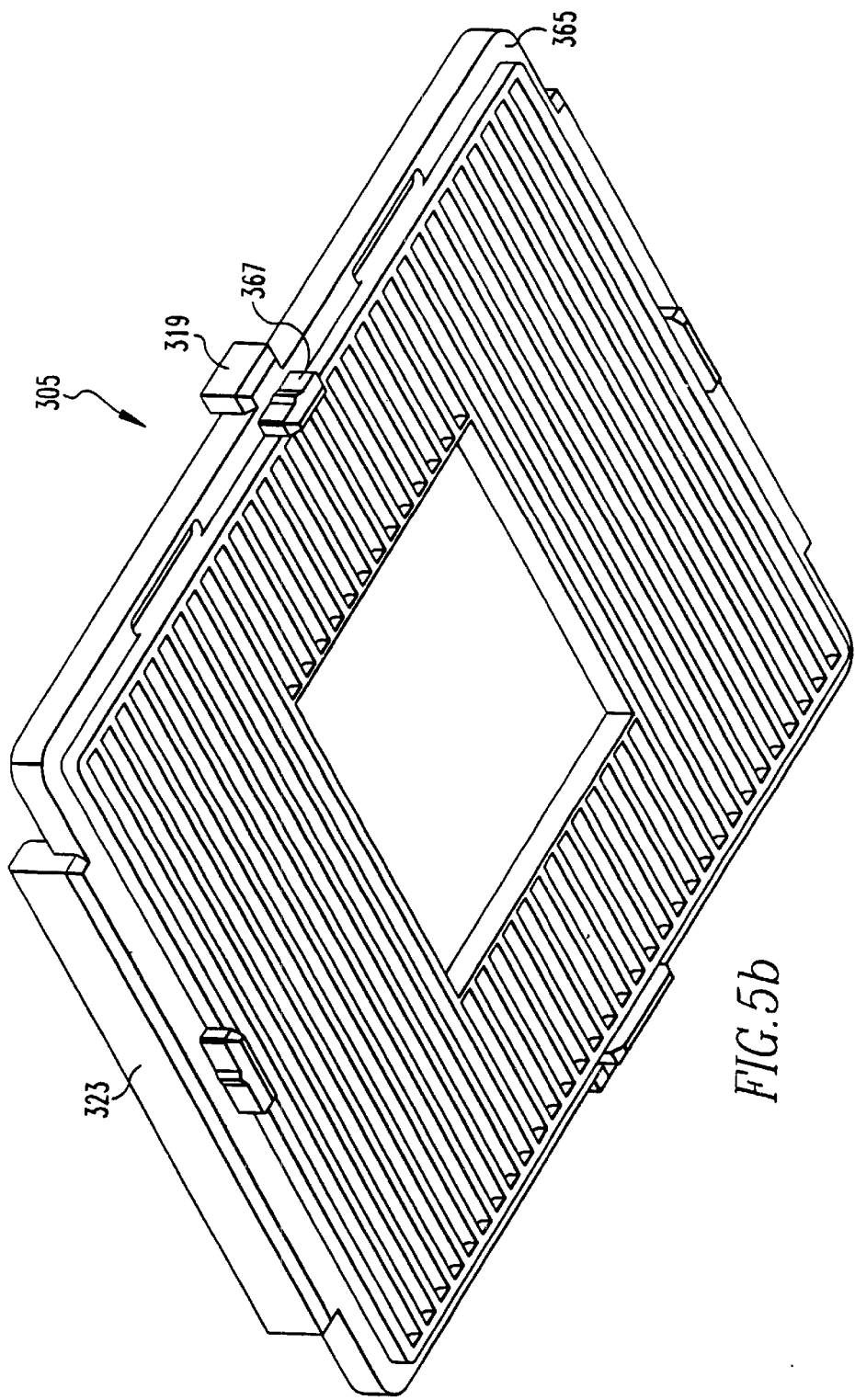
Figure 5C:
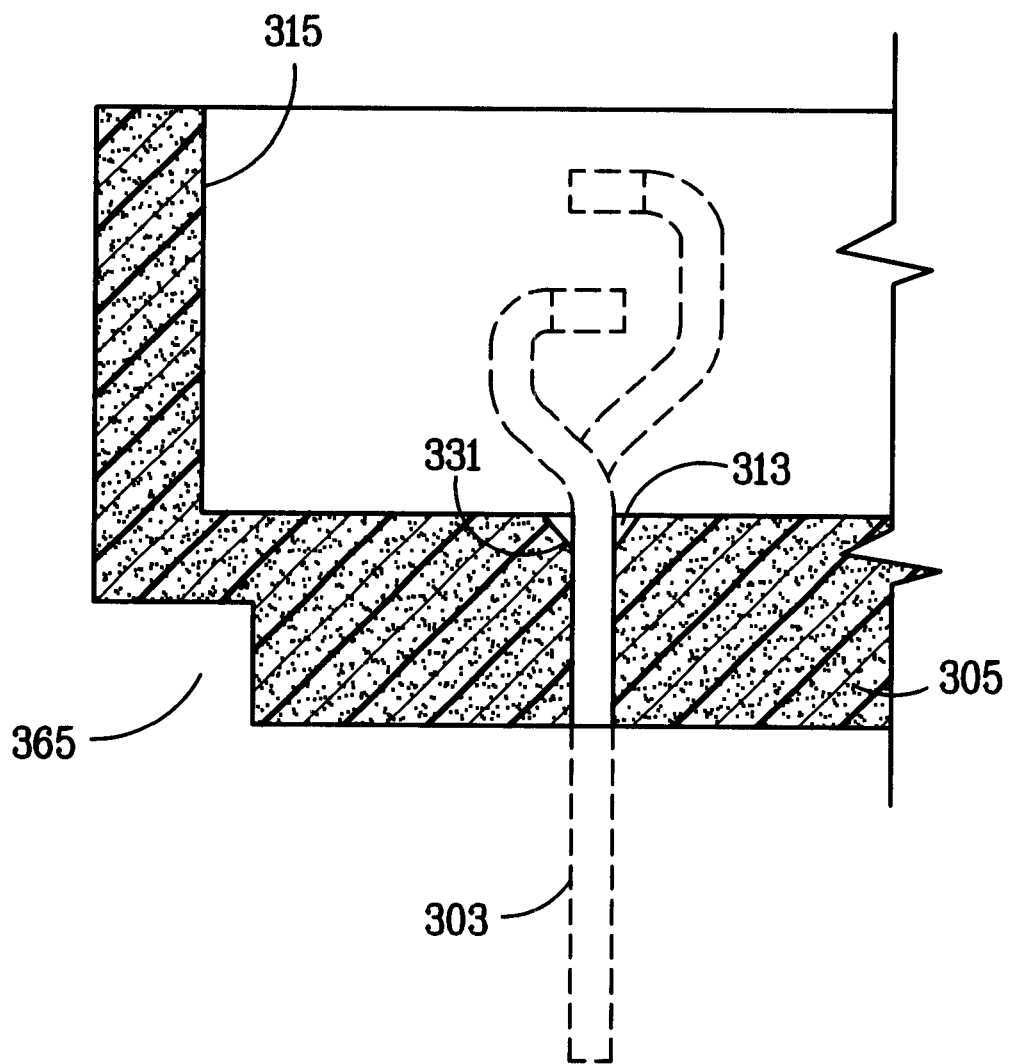
FIG. 5c is a cross-sectional view of the component in FIG. 5a taken along lines Vc—Vc.

Each aperture 313 frictionally retains a corresponding contact 303 therein. As shown in FIGS. 5a and 5c, aperture 313 preferably has a tapered lead-in surface. The lead-in aids in the insertion of contacts 303 into spacer 305 and allows the arms of contact 303 to flex during insertion of interposer pin P.

As seen in FIG. 5a, spacer 305 helps retain and stabilize contacts 303 using deformable ribs 331. Preferably located at the four corners of aperture 313, ribs 331 deform upon insertion of contact 303, but have sufficient rigidity to prevent rotation of contact 303 during mating with interposer pin P.

While providing some rigidity to spacer 305, the geometry of, and various features on, wall 315 also allow spacer 305 to flex. For instance, the inner surface of wall 315 includes channels 317 that correspond to the locations of cut-out sections on the outer wall of contact housing 307. Channels 317 provide a reduced thickness section to wall 315. This allows wall 315 to resile during insertion of contact housing sub-assembly 101 into base frame 401, which is described in more detail below. As discussed earlier, a flexible spacer 305 is desired so that spacer 305, rather than solder masses 309, absorb stresses resulting from CTE mismatch or from interposer pins P mating with contacts 303.

On opposed sides of spacer 305, the outer surface of wall 315 includes blocks 319. Blocks 319 extend past wall 315 as shown in FIG. 4a and reside within notches in base frame 401.

Blocks 319 can have different sizes in order to prevent incorrect placement of contact housing sub-assembly in base plate 401. That way, contact housing sub-assembly 301 could only mount on base plate 401 when blocks 319 align with correspondingly sized notches on base frame 401.

The other opposed sides of wall 315 include splines 323. Similar to blocks 319, 321, splines 323 extend past wall 315 and reside within keyways 221 when cover 201 snap fits onto base frame 401. Splines include a guidance surface 325 flanked by opposed stop surfaces 327, 329.

In the closed position, stop surfaces 225, 327 abut. In the open position, stop surfaces 227, 329 abut. During actuation of socket 100 between the open and closed positions, guidance surface 223 of cover 201 travels along guidance surface 325 of contact housing sub-assembly 301. This arrangement provides direct alignment between cover 201 (containing interposer pins P) and contact housing sub-assembly 301 (containing contacts 303). In other words, the manufacturing tolerances of base frame 401 do not affect the ability of interposer pins P and contacts 303 to align properly.

In addition, splines 323 also reside in notches 415 in base frame 401. Since splines 323 are not interference fitted into notches 415, no stress accumulation occurs. However, the splines are suitably sized relative to notches 415 in order to provide guidance.

Beneath blocks 319 and splines 321, posts 367 extend past the lower surface of base 311 of spacer 305. During the build up of contact housing sub-assembly 301, posts 367 enter corresponding openings in the contact housing 307.

Spacer 305 could be injection molded using a liquid crystal polymer (LCP). While the presence of the number apertures 313 helps increase the flexibility of housing 305, additional flexibility may be required. Flexibility could be increased by adjusting the relative dimensions of housing 305. For example, base 311 could have a thickness of 1.28 mm and peripheral wall 315 could have a height of 0.95 mm and a thickness of 0.75 mm.

FIGS. 4b, 6a, 6b and 6c display contact housing 307. Similar to spacer 305, contact housing 307 is made from a suitable insulative material such as a high temperature thermoplastic and includes a planar base 333 with an array of apertures 335 therethrough. A peripheral wall 337 extends around base 333.

Figures 6A, 6B:
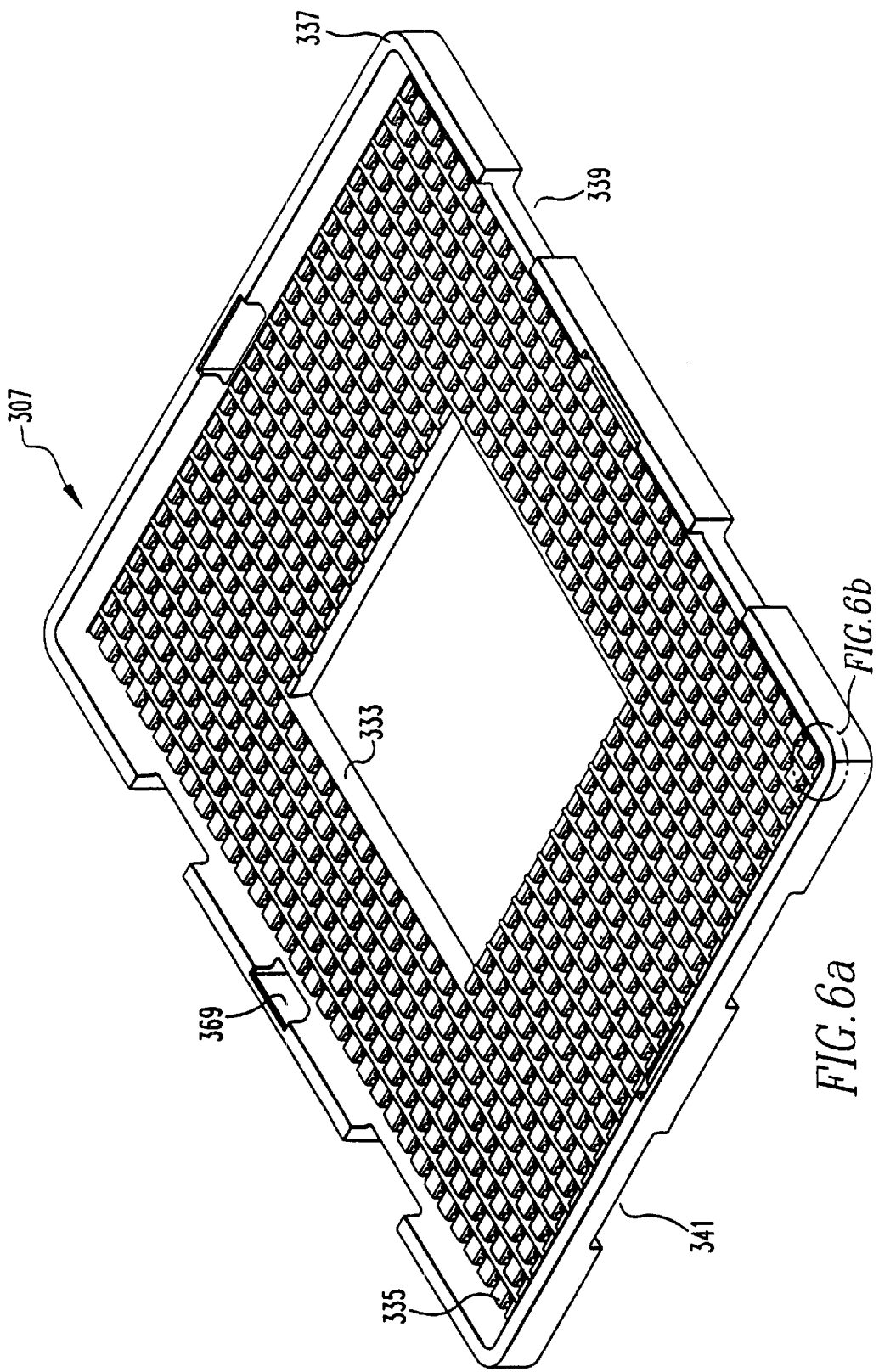
Figure 6B:
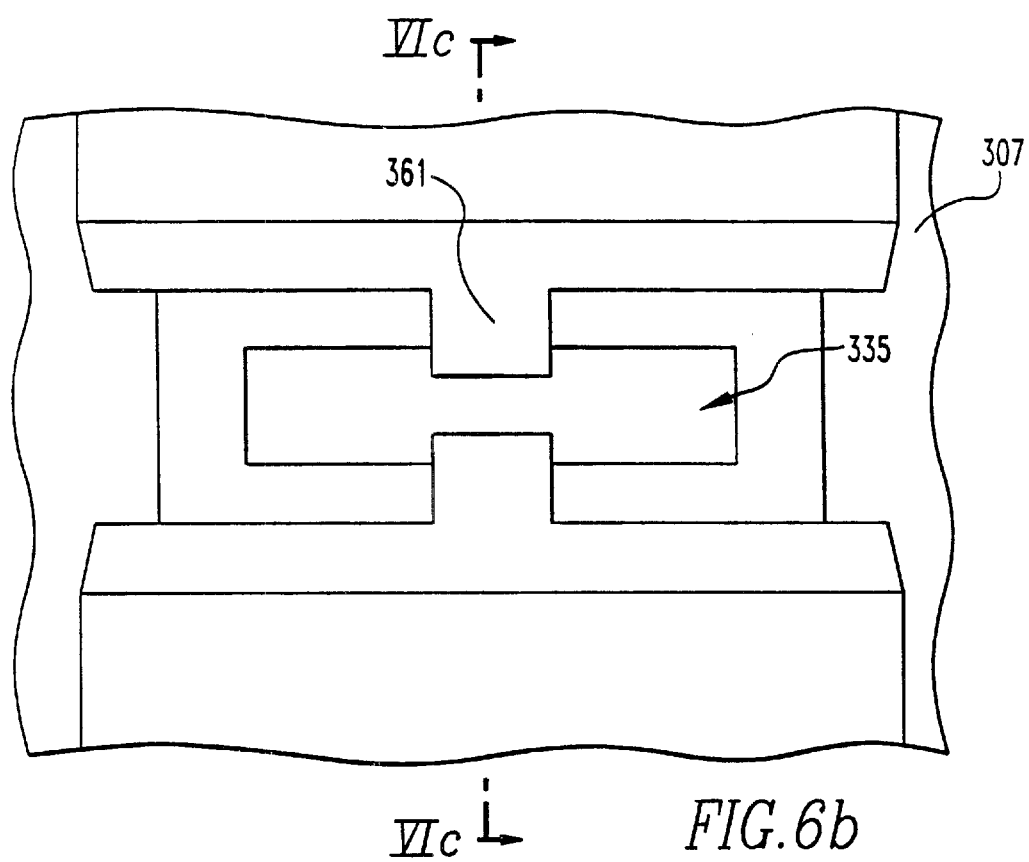
Figure 6C:
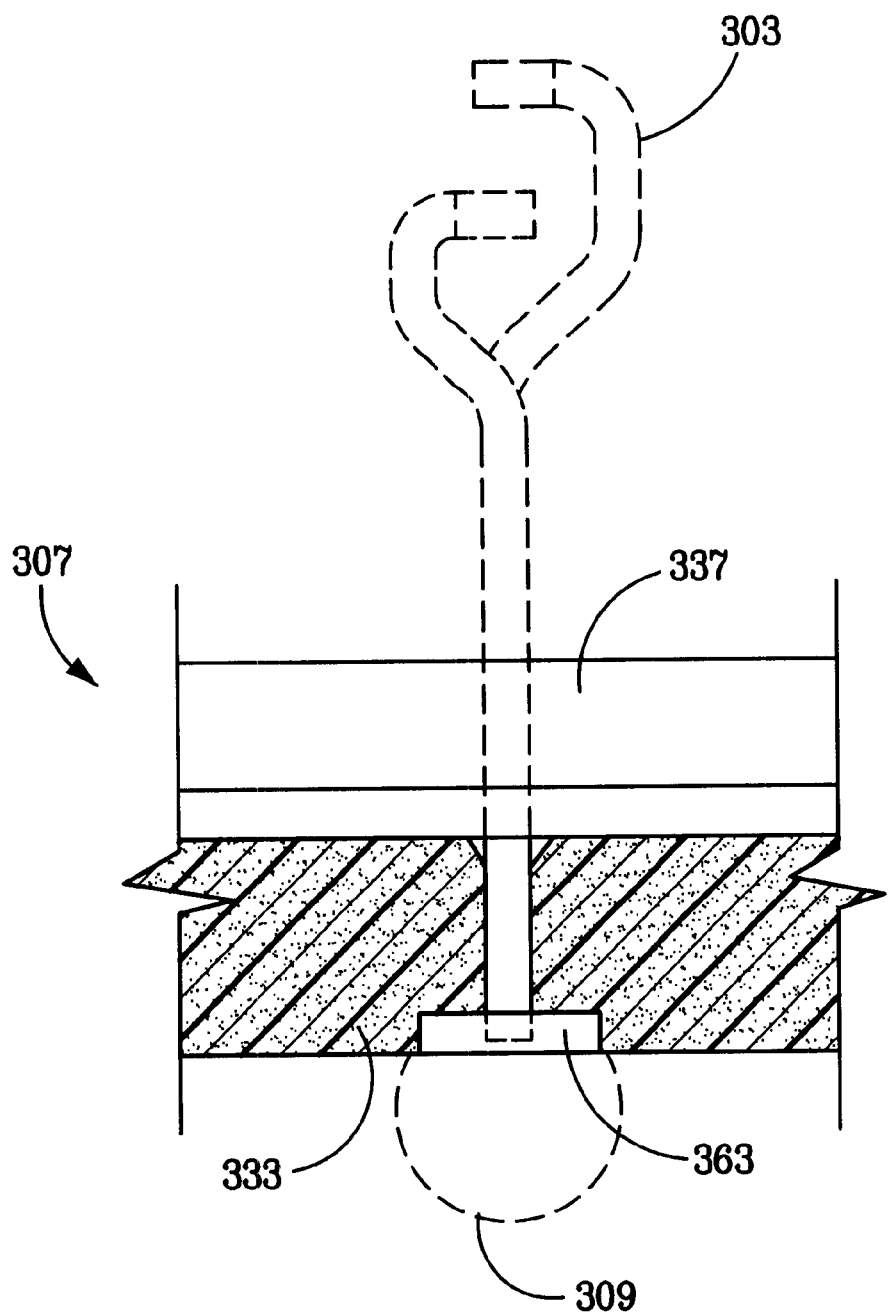
FIG. 6c is a cross-sectional view of the component in FIG. 6b taken along lines VIb—VIb.

Each aperture 335 frictionally retains a corresponding contact 303 therein. As shown in FIGS. 6b and 6c, aperture 335 preferably has a tapered lead-in surface. The lead-in aids in the insertion of contacts 303 into contact housing 307 and acts as a stop for shoulders 359. Once shoulder 359 engages the lead-in portion of aperture 335, contact 303 cannot extend further into aperture 335.

Deformable ribs 361 in aperture 335 help contact housing 307 retain contacts 303. Preferably, ribs 361 are centrally located on opposite side walls of aperture 335.

Aperture 335 should also have a recess 363 at a mounting end. Recess 363 allows a portion of solder mass 309 to reside therein.

The outer surface of peripheral wall 337 includes various features that interact with corresponding features on base frame 401 to retain contact housing subassembly 301 in base frame 401. Opposite sides of peripheral wall 337 include cut-out sections 339. Cut-out sections 339 allow contact housing 307 to pass freely by latch structure on base frame 401 during placement of contact housing sub-assembly 301 into base frame 401. The other opposite sides of peripheral wall 337 include notches 341. When inserting contact housing 307 into base frame 401, notches 341 rest on an upper surface of a ledge projects inwardly from a wall defining a central opening.

Each side of the inner surface of peripheral wall 337, along with a corresponding portion of base 333, includes an opening 369. Openings 369 receive posts 367 on spacer 305.

Contact housing 307 could be injection molded using a liquid crystal polymer (LCP). While the apertures help increase the flexibility of contact housing 307, additional flexibility may be required. As with spacer 305, the flexibility could be increased by adjusting the relative dimensions of contact housing 307. For example, base 333 could have a thickness of 1.02 mm and peripheral wall 337 could have a height of 0.78 mm and a thickness of 0.75 mm.

Figure 7A:
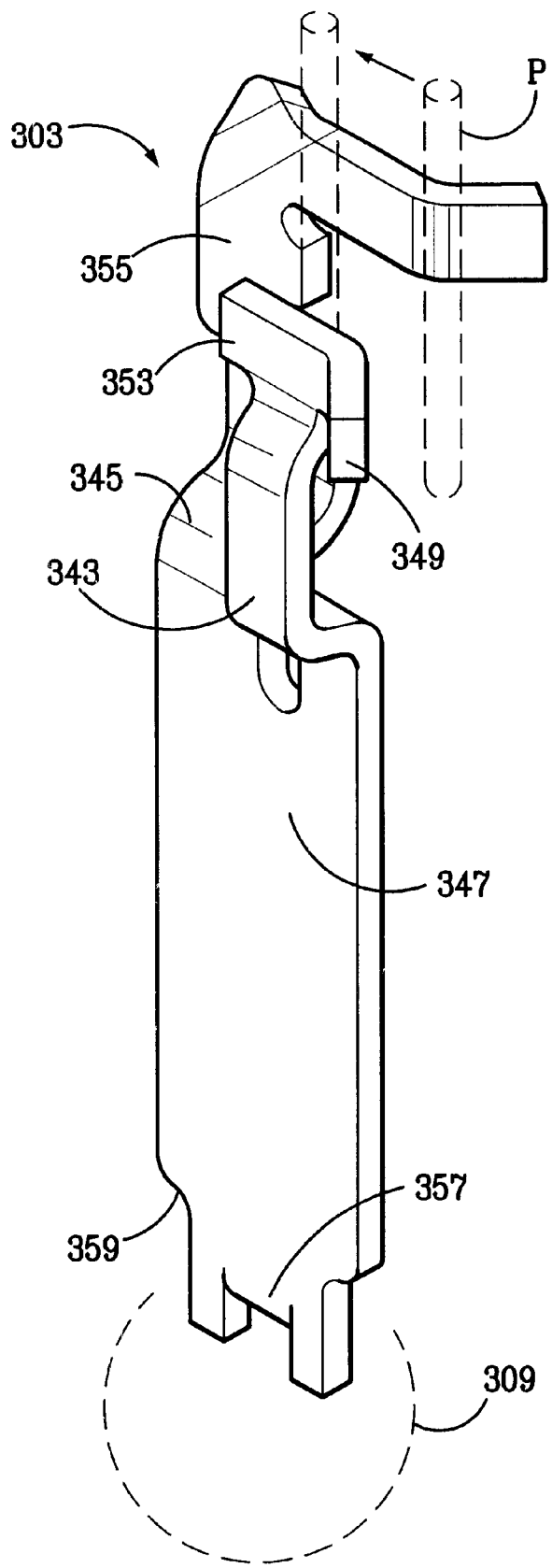
Figure 7B:
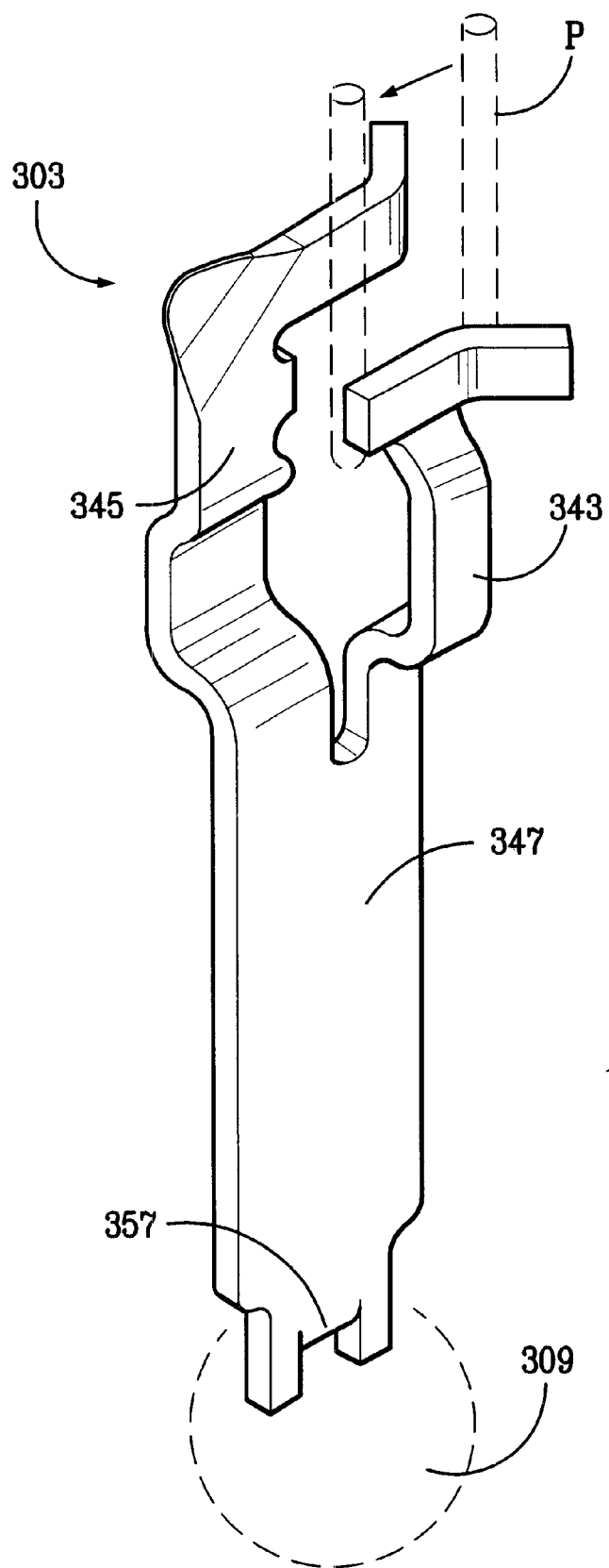
Figure 7C:
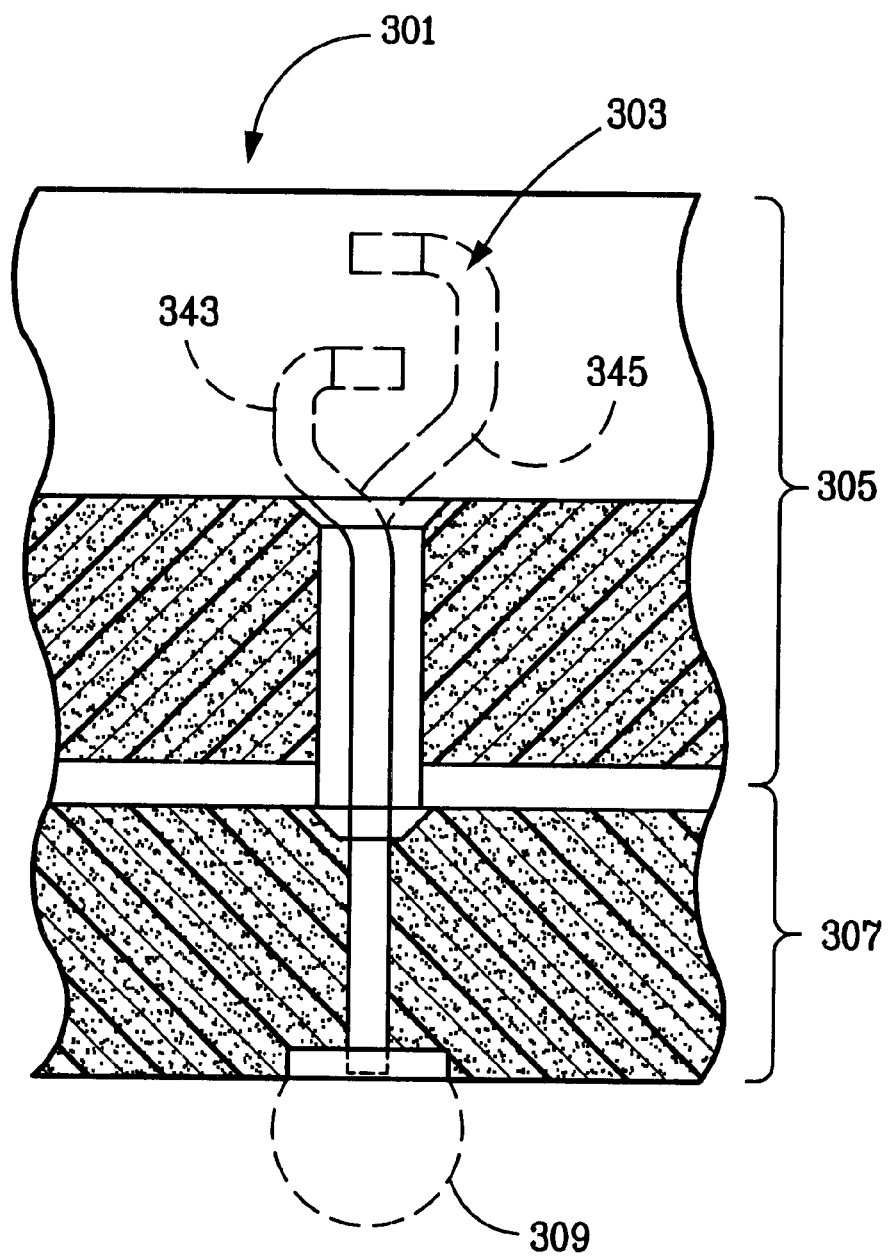
FIG. 7c is a cross-sectional view of the sub-assembly in FIG. 4a taken along lines VIIb—VIIb.

FIGS. 7a and 7b display contact 303. Contact 303, preferably stamped and formed from a carrier strip of conductive material such as a copper alloy, has dual beams 343, 345 extending from one end of a base section 347. The opposite end of base section 347 includes a mounting section 357 flanked by shoulders 359.

Each beam 343, 345 has a respective lead-in portion 349, 351 between which pin P enters when socket receives interposer I on cover 201 in an open position (shown in phantom in FIG. 7a). Actuation of socket 100 towards a closed position moves pin P towards respective mating portions 353, 355 of beams 343, 345 (shown in phantom in FIG. 7a). Mating portions 353, 355 engage opposite sides of interposer pin P.

As seen in FIG. 7b, beam 343 is shorter than beam 345. Although engaging opposite sides of interposer pin P, beams 343, 345 engage pin P at different elevations on pin P. In order to balance the spring rates of beams 343, 345, the width of long beam 345 can be greater than the width of short beam 343.

A mounting section 357 extends from an opposite end of base section 347. Preferably, mounting section 357 is a surface mount section. Although any surface mount termination could be used, FIG. 7a shows the preferred contact 303 capable of surface mounting to motherboard M using BGA technology. Furthermore, other mounting techniques (e.g. pin-in-paste, press-fit) could be used. International Publication numbers WO 98/15989 and WO 98/15991, herein incorporated by reference, describe methods of securing a solder mass 309, such as a fusible solder ball, to a contact retained by an insulative housing and to a pad on a circuit substrate.

Preferably, constructing contact housing sub-assembly 301 involves the following. First, spacer 305 and contact housing 307 are stacked so that posts 367 enter and engage openings 369. When stacked, peripheral recess 365 of spacer 305 rests on the upper surface of peripheral wall 337 and the bottom surface of base 311 of spacer 305 rests on the upper surface of base 333 of contact housing 307.

Second, contacts 303 are inserted into apertures 313, 335 until shoulders 359 abut the tapered lead-in of aperture 335 of contact housing 307. In that position, beams 343, 345 extend upwardly from spacer 305 and mounting portion 357 extends downwardly from contact housing 307.

Finally, solder mass 309 is secured to contact 303 using, for example, the reflow techniques described in International Publication numbers WO 98/15989 and WO 98/15991. The combination of shoulder 357 of contact 303 abutting the tapered lead-in of aperture 313 and of solder mass 309 securing to mounting end 357 of contact 303 serves to lock connector housing sub-assembly 301 together.

Figure 8A:
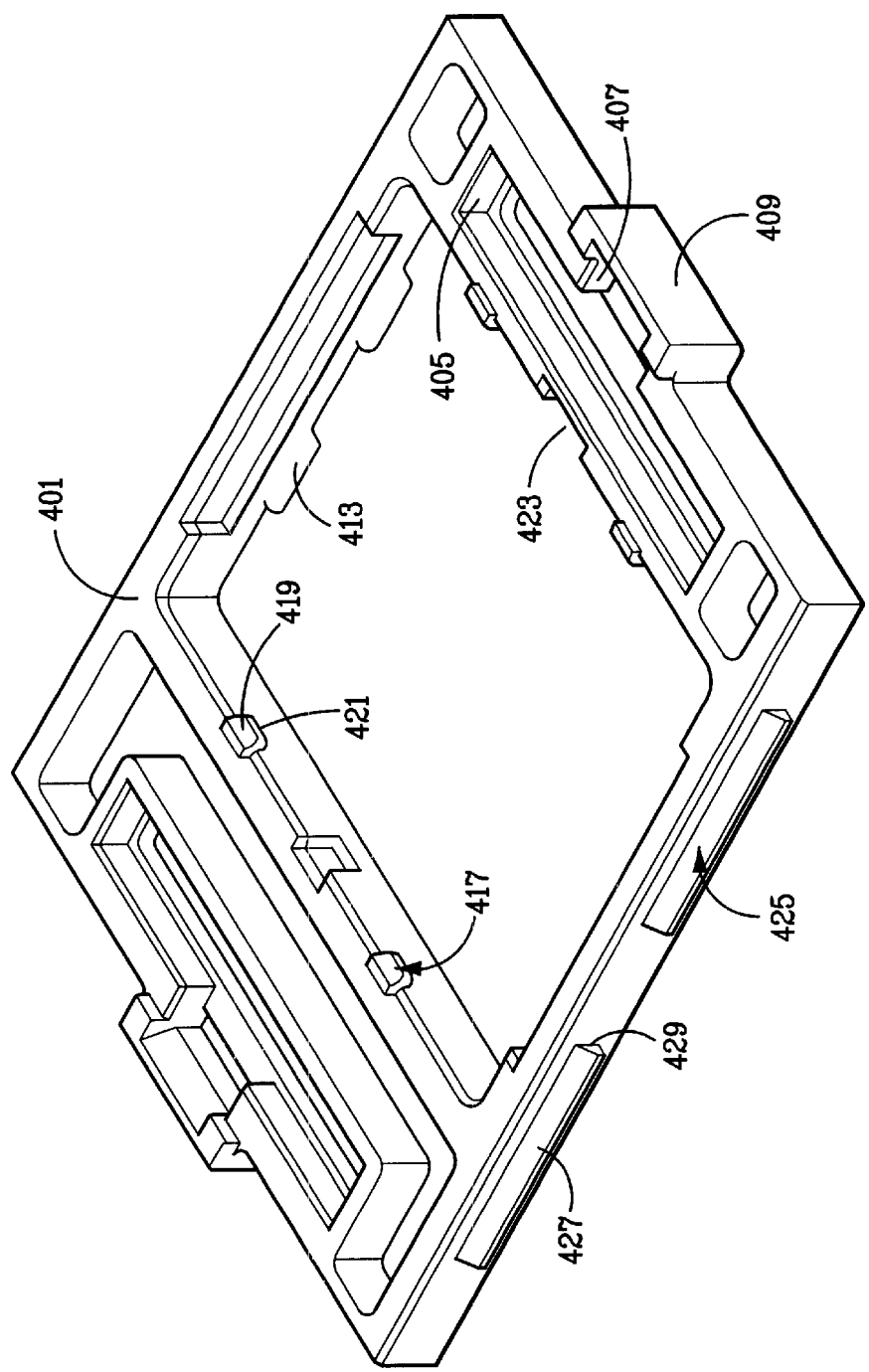
Figure 8B:
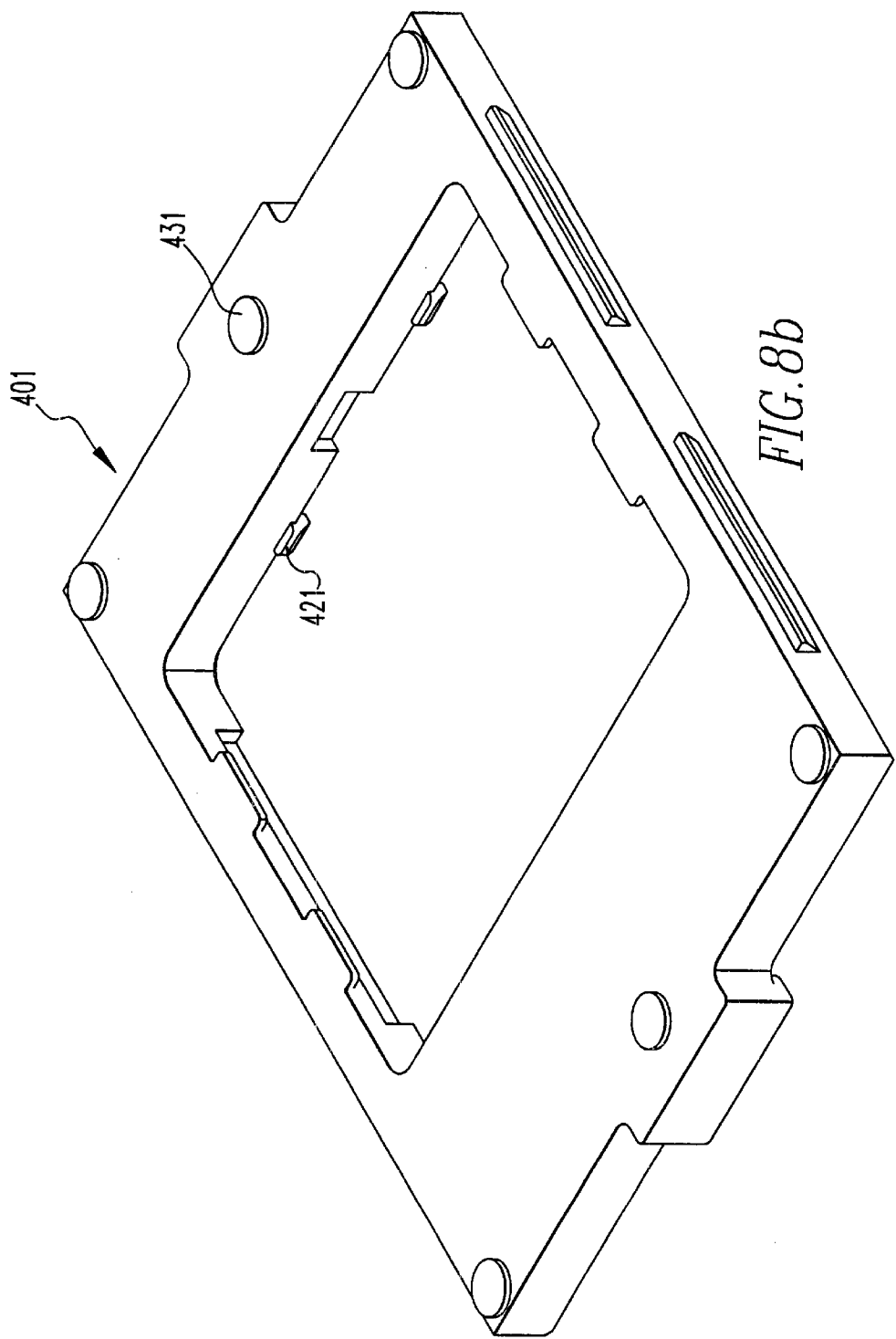

FIGS. 8a and 8b display base frame 401. As with the other components of socket 100, base frame 401 is made from a suitable insulative material such as a high temperature thermoplastic. In order to have sufficient flexibility, base frame 401 has a generally rectangular shape with a central opening 403 along with various recessed areas. Base frame 401 secures to motherboard M independently of contact housing sub-assembly 301. Specifically, a lower surface of base frame 401 can have solder pads 431 to surface mount to motherboard M.

Opposed ends of base frame 401 each include an opening 405 that receives a corresponding rib 215 on cover 201. Openings 405 are appropriately sized to allow ribs 215 to travel freely therein as socket 100 travels between an open and a closed position. Opening 405 communicates with a notch 407. A projection 409 extends from base frame 401 and encloses notch 407. When cover 201 snap fits onto base frame 401, openings 411 form between an edge of cover 201 and projection 409.

Openings 411 are sized to allow entry of tool T to actuate socket 100. Tool T enters and engages a bottom surface of opening 411. The bottom surface of opening 411 provides the leverage point for tool T to move cover 201. Since base frame 401 secures to motherboard M separately from contact housing sub-assembly 301, any forces caused by tool T during actuation do not transfer to contact housing sub-assembly 301.

Figure 9A:
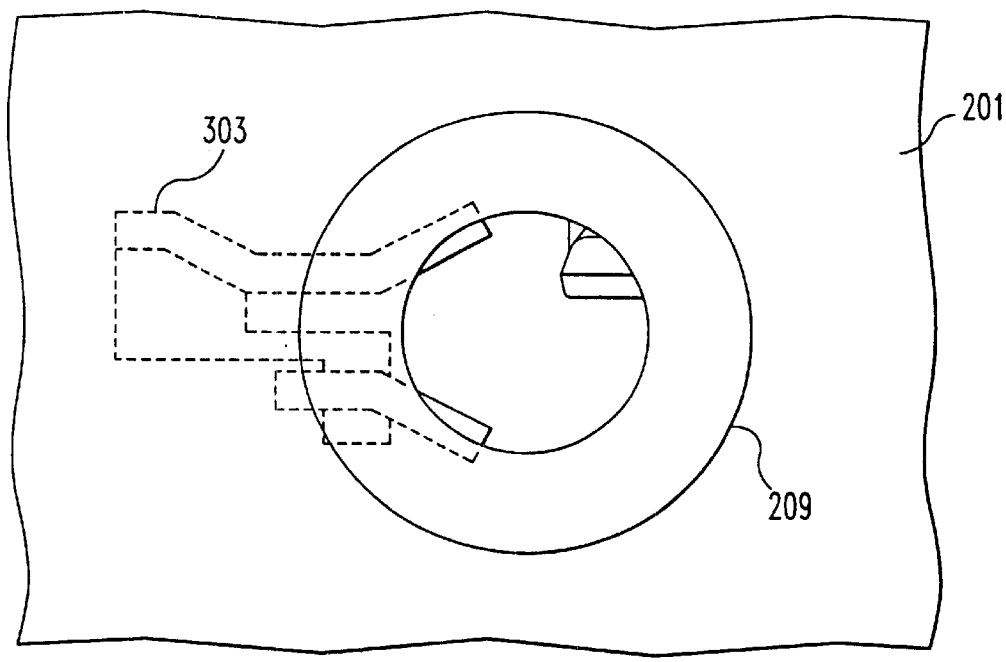
FIG. 9a and 10a are a detailed view and a cross-sectional view (taken along line Xa—Xa), respectively, of the electrical connector in FIG. 1a in an open position.
Figure 9B:
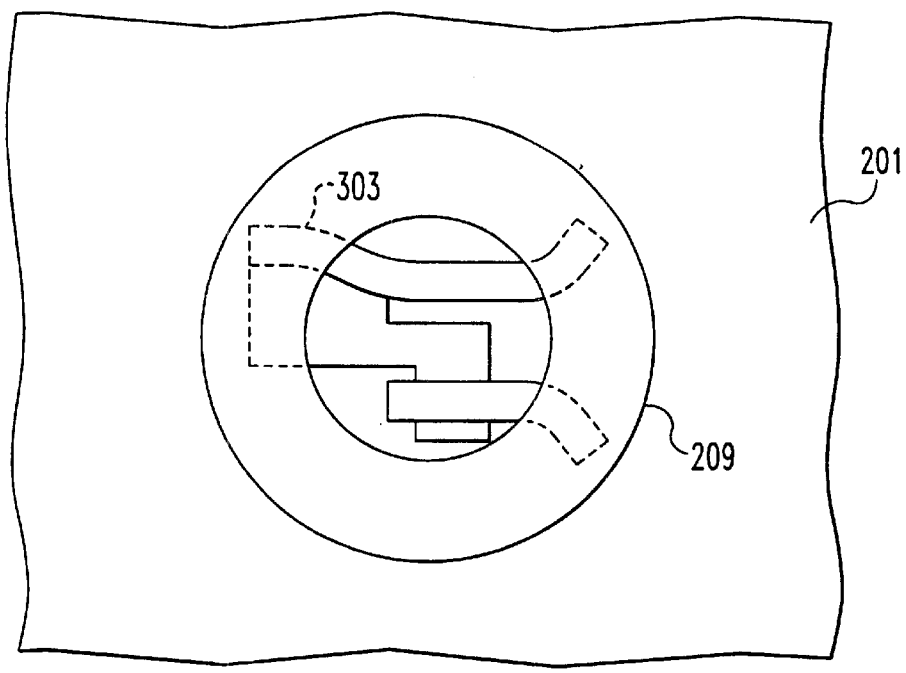
FIGS. 9b and 10b are a detailed view and a cross-sectional view (taken along line Xa—Xa) of the electrical connector in FIG. 1a in a closed position.
Figure 10A:
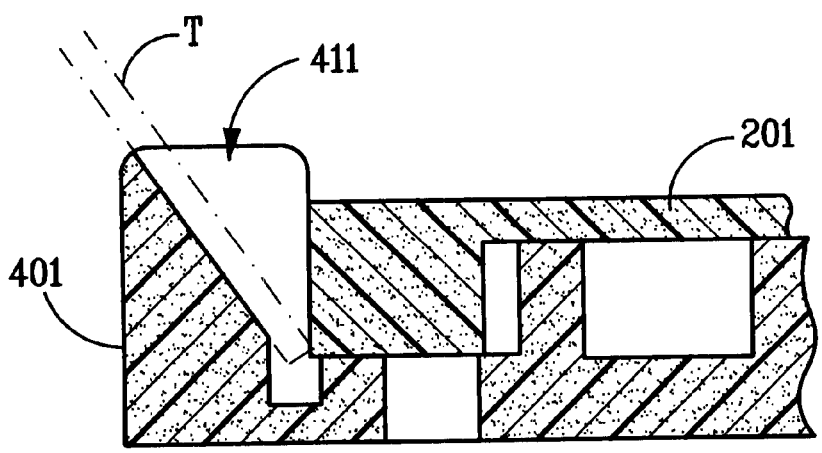
Figure 10B:
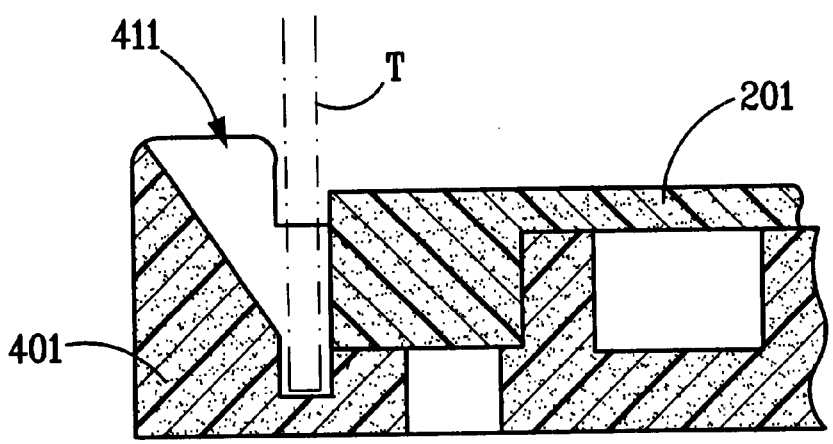

Rotation of tool T moves cover 201 along base frame 401. As shown in FIG. 9b, when socket 100 is in an open position, pin P can freely enter aperture 209 and the space between dual beams 343, 345 of contact 303. Upon actuation of socket 100 to a closed position as shown in FIG. 9b, pins P engage mating portions 353, 355. Dual beams 343, 345 resile in order to provide a suitable normal force to pins P.

The inner walls of base frame 401 that define central opening 403 include various features that help retain contact housing sub-assembly in base frame 401. One set of opposite walls include ledges 413. Contact housing sub-assembly 301, specifically contact housing 307, rests on the upper surfaces of ledges 413. In other words, ledges 413 prevent contact housing sub-assembly 301 from exiting base frame 401.

The other set of opposing walls has latching structures 417. During insertion of contact housing sub-assembly 301 into base frame 101, the reduced thickness portions of peripheral wall 315 and tapered surface 419 engage one another and deflect. Upon complete insertion, the reduced thickness portion of spacer 305 and tapered surface 419 resile to their normal, unloaded position. Once snap fitted onto base frame 401, the upper surface of peripheral wall 315 abuts lower surface 421. In other words, latching structures 417 prevent contact housing subassembly 301 from exiting base frame 401.

As seen in FIG. 8a, only ledges 413 and latching structure 417 retain contact housing sub-assembly 301 on base frame 401. In addition, contact housing sub-assembly 301 fits within base frame 401 without interference. This loose coupling between base frame 401 and contact housing sub-assembly 301 helps prevent stresses from accumulating in the solder joints.

The inner walls of base frame 401 that define central opening 403 also include notches 415 that can accommodate splines 325. Although contact housing sub-assembly nests within base frame 401, splines 325 extend past the upper surface of base frame 401. This allows splines 325 to enter keyways 221 in cover 201.

The inner walls of base frame also include notches 423 flanked by latching structures 417. Notches 423 receive blocks 319 on contact housing sub-assembly 301. Blocks 319, however, do not extend past the upper surface of base frame 401. Blocks 319 and splines 325 are not interference fitted in to notches 423, 415, respectively. Notches 415, 423 do, however, provide guidance to contact housing sub-assembly 301.

Opposite sides of the outer edge of base frame 401 includes latching structure 425. Latching structure 425 retains cover 201 on base frame 401. Sidewalls 205 of cover 201 deflect upon engaging tapered walls 427 of latching structures 425. Upon full engagement, sidewalls 205 resile to their normal position, with the walls that define recesses 213 engaging lower surface 429. In this position, cover 201 is secured to base frame 401, but movable relative thereal-ong between the open and closed position.

FIG. 11 displays an alternative embodiment of the present invention. In order to avoid repetition of generally similar features previously described in the first embodiment above, only a discussion of the differences follows.

Rather than a single keyway 221 along each side of cover 201 and a single spline 323 along each side of contact housing sub-assembly 301, this alternative embodiment provides cover 201' with several smaller keyways 221' along each side and contact housing sub-assembly 301' has several smaller splines 323'.

Providing these smaller features helps distribute stresses more evenly across cover 201'and across contact housing sub-assembly 301'. In addition, these smaller features provide redundant guide surfaces 325' and stop surfaces 327', 329'. For example, if the first spline 323' becomes sufficiently damaged, the stop surfaces 327', 329' may no longer provide accurate alignment between cover 201' and the rest of socket 100'. The next spline 323' along the line of splines 323' will, however, provide accurate alignment between cover 201' and the rest of socket 100' with guide surface 325' and stop surfaces 327', 329'.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. An electrical connector mountable to a substrate, comprising:

a frame mountable to the substrate, the frame including inner walls that define a central through opening, and upper and lower structures that extend into said central through opening;

a housing interposed between said upper and lower structures such that said housing is loosely coupled to and supported by said frame at discrete locations; and a plurality of contacts extending through said housing and mountable to the substrate.

2. The electrical connector as recited in claim 1, further comprising a solder mass attached to each of said plurality of contacts.

3. The electrical connector as recited in claim 3, wherein said solder masses are fusible elements.

4. The electrical connector as recited in claim 3, wherein said solder masses are solder balls.

5. The electrical connector as recited in claim 1, wherein said frame and said housing are made from an insulative material.

6. The electrical connector as recited in claim 1, said upper structures are offset from said lower structures.

7. A socket for connecting an electrical component to a substrate, comprising:

a housing, including:
    a contact mountable to the substrate and adapted to engage a terminal of the electrical component, and housing guidance structure;

a frame mountable to the substrate and supporting said housing, said frame including frame guidance structure; and a cover slideably secured to said frame and including:
    first guidance structure that corresponds to said housing guidance structure so that said cover aligns with said housing and can move between a first and a second position;
    second guidance structure that corresponds to said frame guidance structure so that said cover can travel between said first position and said second position; and
    an opening so that said contact can engage the terminal of the electrical component.

8. The socket as recited in claim 7, wherein said first guidance structure on said cover comprises at least one slot and said housing guidance structure comprises at least one block located within said at least one slot.

9. The socket as recited in claim 8, wherein said at least one slot comprises a plurality of slots and said at least one block comprises a plurality of blocks.

10. The socket as recited in claim 8, wherein said at least one slot includes opposed first and second stop surfaces and said at least one block includes opposed first and second stop surfaces, wherein, in said first position, said first stop surface of said at least one slot abuts said first stop surface of said at least one block, and, in said second position, said second stop surface of said at least one slot abuts said second stop surface of said at least one block.

11. The socket as recited in claim 7, further comprising a solder mass secured to said contact.

12. The socket as recited in claim 11, wherein said solder mass is a fusible element.

13. The socket as recited in claim 11, wherein said solder mass is a solder ball.

14. The electrical connector as recited in claim 7, wherein said first guidance structure is a keyway and said corresponding housing guidance structure is a spline fitted within said keyway in a non-interfering manner.

15. The electrical connector as recited in claim 7, wherein said frame guidance structure is a recess said corresponding second guidance structure is a latch fitted within said recess in a non-interfering manner.

16. An electrical system, comprising:
a electrical component having a terminal;
a substrate having a conductive element; and
an electrical connector mounted to said substrate and adapted to removably secure said electrical component to said substrate, comprising:
a housing, including:
a contact mounted to said substrate and adapted to engage a terminal of said electrical component, and
housing guidance structure;
a frame mountable to said substrate and supporting said housing, said frame including frame guidance structure; and
a cover slideably secured to said frame and including:
first guidance structure that corresponds to said housing guidance structure so that said cover aligns with said housing and can move between a first and a second position;
second guidance structure that corresponds to said frame guidance structure so that said cover can travel between said first position and said second position; and
an opening so that said contact can engage said terminal of said electrical component.

17. The electrical system as recited in claim 16, wherein said substrate is a printed circuit board.

18. The electrical system as recited in claim 16, wherein said electrical component includes a microprocessor.

19. The electrical system as recited in claim 18, wherein said electrical component is an interposer having an array of pins extending therefrom.

20. The electrical connector as recited in claim 16, wherein said first guidance structure is a keyway and said corresponding housing guidance structure is a spline fitted within said keyway in a non-interfering manner.

21. The electrical connector as recited in claim 16, wherein said frame guidance structure is a recess said corresponding second guidance structure is a latch fitted within said recess in a non-interfering manner.

22. An electrical connector mountable to a substrate, comprising:
a frame mountable to the substrate;
a contact housing sub-assembly loosely coupled to said frame, the contact housing sub-assembly comprising a first layer in juxtaposition with a second layer, each of said first layer and said second layer including a peripheral wall comprising sections of reduced thickness such that the flexibility of said first and second layers is increased; and
a plurality of contacts extending through said contact housing sub-assembly and mountable to the substrate.

23. The electrical connector as recited in claim 22, wherein said frame supports said contact housing sub-assembly at discrete locations.

24. The electrical connector as recited in claim 23, wherein said contact housing sub-assembly is interposed between upper and lower structures extending from inner walls of said frame.

25. The electrical connector as recited in claim 22, wherein said first layer is a contact housing and said second layer is a spacer.

26. The electrical connector as recited in claim 25, wherein the peripheral wall of said spacer includes at least one channel formed therein.

27. The electrical connector as recited in claim 25, wherein the peripheral wall of said contact housing includes at least one cutout formed therein.

28. The electrical connector as recited in claim 22, wherein said frame comprises a central through opening.

29. The electrical connector as recited in claim 22, further comprising a cover movably secured to said frame, said cover comprising a central opening.

30. The electrical connector as recited in claim 22, wherein said frame and said contact housing sub-assembly are molded from a material comprising liquid crystal polymer.

31. An electrical connector mountable to a substrate, comprising:
a frame mountable to the substrate;
a contact housing loosely coupled to said frame, said housing including a plurality of apertures comprising deformable ribs extending inwardly therein; and
a plurality of contacts extending through said contact housing, at least partially retained by said deformable ribs, and mountable to the substrate.

32. The electrical connector as recited in claim 31, wherein each of said plurality of apertures comprise corners and said deformable ribs are located at the corners.

33. The electrical connector as recited in claim 31, wherein said deformable ribs are centrally located on opposite side walls of said plurality of apertures.

34. The electrical connector as recited in claim 31, wherein said contact housing comprises a first layer in juxtaposition with a second layer.

35. The electrical connector as recited in claim 34, wherein both of said first layer and said second layer include a plurality of apertures comprising deformable ribs extending inwardly therein.

* * * * *